United States Patent [19]

Bailey

[11] 4,372,985

[45] Feb. 8, 1983

[54] ION IMPLANTATION FOR HARD BUBBLE SUPPRESSION

[75] Inventor: Robert F. Bailey, Rossmoor, Calif.

[73] Assignee: Rockwell International Corporation, El Segundo, Calif.

[21] Appl. No.: 213,976

[22] Filed: Dec. 8, 1980

[51] Int. Cl.$^3$ .............................................. B05D 3/06
[52] U.S. Cl. ................................ 427/38; 204/192 N; 250/492.3; 365/36; 427/127; 427/130; 427/131
[58] Field of Search ........................... 365/36; 427/38; 204/192 N; 427/130, 131, 127; 250/492 B

[56] References Cited

U.S. PATENT DOCUMENTS

| | | | |
|---|---|---|---|
| 3,792,452 | 2/1974 | Dixon et al. ........................ | 427/38 |
| 3,795,542 | 3/1974 | Halaby et al. ...................... | 427/38 |
| 4,098,917 | 7/1978 | Bullock et al. ..................... | 427/36 |
| 4,122,538 | 10/1978 | Lins ............................... | 365/36 X |
| 4,196,228 | 4/1980 | Priel et al. ....................... | 427/38 X |
| 4,256,780 | 3/1981 | Gaerttner et al. ................... | 427/38 |

FOREIGN PATENT DOCUMENTS 2001219  1/1979  United Kingdom .

OTHER PUBLICATIONS

Lin et al., IEEE Transactions on Magnetics, vol. MAG-13, No. 16, (Nov. 1977), "Contiguous-Disk Bubble Domain Devices", pp. 1744–1764.

IBM Technical Disclosure Bulletin, vol. 17, No. 11, Apr. 1975.

Journal of Vacuum Science & Tech., vol. 15, No. 5, Sep./Oct. 1978, North et al., "Applications of Ion Implantation to Magnetic Bubble Devices", pp. 1675–1684.

Primary Examiner—Thurman K. Page
Attorney, Agent, or Firm—H. Fredrick Hamann; Daniel R. McGlynn

[57] ABSTRACT

A method for processing a magnetic bubble domain device for hard bubble suppression comprising the steps of providing a non-magnetic substrate; providing a thin layer of magnetic material capable of supporting magnetic bubble domains on a first major surface of the substrate; and directing a beam of ions consisting essentially of a nongaseous ion at the substrate.

3 Claims, 1 Drawing Figure

• HYDROGEN
X HELIUM
△ BORON
○ NEON

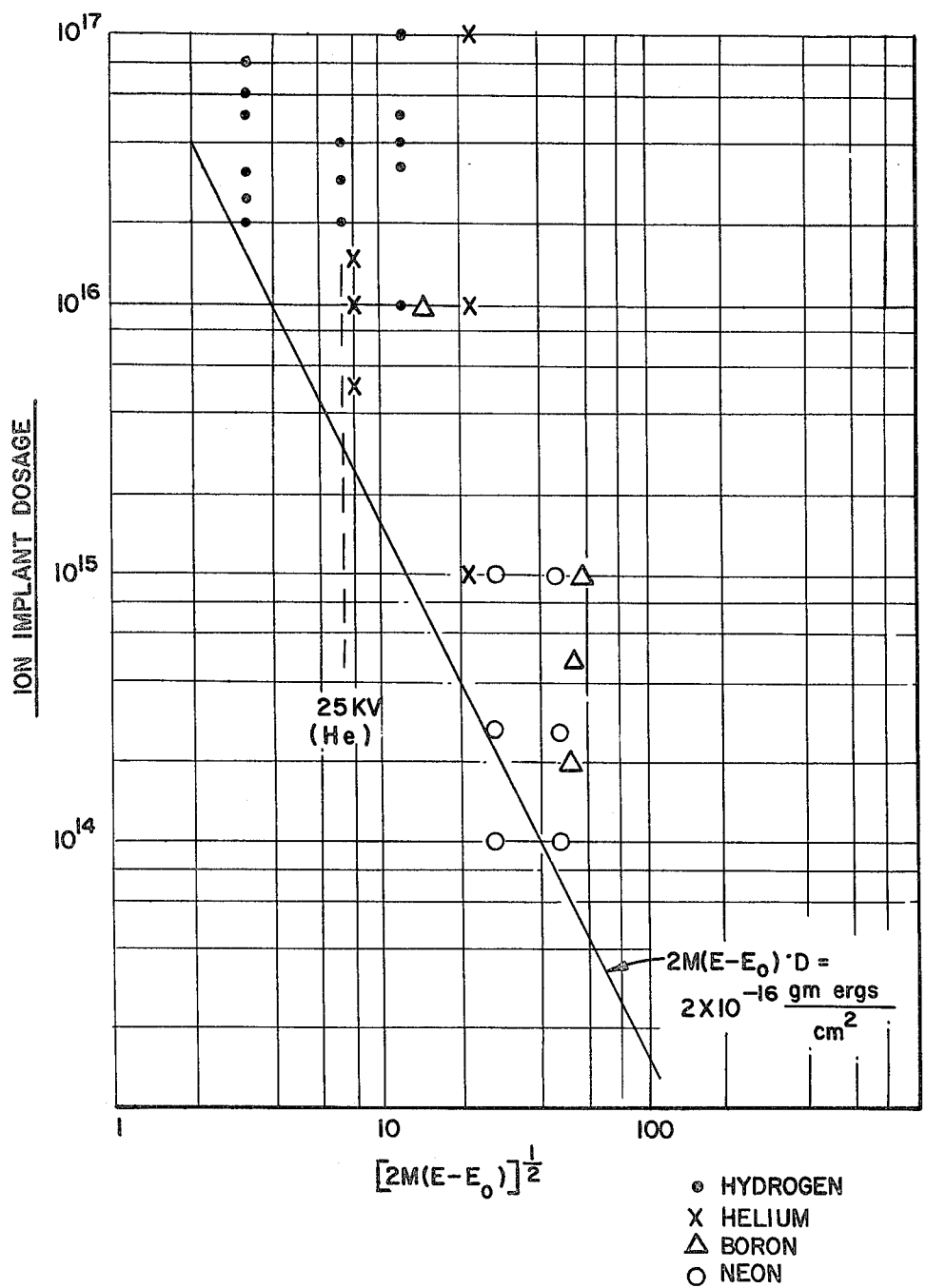

ION IMPLANTATION FOR HARD BUBBLE SUPPRESSION

BACKGROUND OF THE INVENTION

1. Field of the Invention

The invention relates to the preparation of magnetic bubble device material, and in particular to the use of ion implantation for hard bubble suppression.

2. Description of the Prior Art

The use of ion implantation of gases such as helium and neon into the layer of a magnetic bubble device material for hard bubble suppression is known in the prior art.

Hard bubbles are those which collapse at bias fields up to 50 percent higher than normal bubbles, move at an angle to the magnetic field gradient used for propagation, and move at a lower velocity than normal bubbles. Hard bubbles must be suppressed in all circuit applications as a potential source of data error. The complex wall states responsible for the hard bubble behavior are inhibited from forming if a domain wall covers an end of the cylindrical bubble domains. In the prior art, ion implantation of Noble gases has been the most convenient and wide-spread means for suppressing hard bubbles.

However, there are several disadvantages with the use of these gases, such as the relatively long amount of time required to perform the ion implantation, and the use of non-standard implant material in the layer.

In ion implanted films, when the stress-induced anisotropy of the ion-damaged region exceeds the $K_u$ of the bubble material, a layer of in-plane magnetization forms which is separated by a 90-degree domain wall from the underlying bubble material. Obviously, small bubble compositions with higher $K_u$ will require higher implantation-induced anisotropy to suppress hard bubbles. Since $K_u$ increases rapidly as the temperature is reduced, an investigation of hard bubble suppression over the temperature range was carried out on small bubble material using both ion implantation and an alternate technique.

During ion implantation, gaseous ions which have been accelerated by a high electric field strike the garnet surface and penetrate some distance, causing atomic displacements that expand the garnet lattice. The implanted region is constrained from expanding parallel to the film surface by the relatively great thickness of substrate crystal below, which places the implanted layer in compressive stress. Acting through the inverse magnetostriction effect, this stress produces an induced anisotropy, $K_i$, given by $$K_i = -(3/2)\sigma\lambda_{111},$$

where $\sigma$ is the stress and $\lambda_{111}$ is the magnetostriction constant of the bubble material. If $\lambda_{111}$ is negative, the compressive stress causes $K_i$ to be negative. (By convention, negative $K_i$ creates an easy axis parallel to the film plane). If $K_i$ exceeds the $K_u$ of the as-grown bubble material, an implanted in-plane magnetization layer forms. When this implanted layer is sufficiently thick, a 90-degree domain wall is formed between the in-plane magnetization and the perpendicular magnetization of the underlying undamaged bubble material.

SUMMARY OF THE INVENTION

Briefly, and in general terms, the invention relates to a method for processing a magnetic bubble domain device including the steps of providing a non-magnetic substrate; forming a thin layer of magnetic material capable of supporting magnetic bubble domains on a first major surface of the substrate; and directing a beam of ions consisting essentially of a nongaseous element at the substrate, preferably boron, arsenic, gallium, phosphorus, aluminum; zinc, or silicon. The energy of the beam of ions is preferably from 20 to 50 keV.

The novel features which are considered as characteristic for the invention are set forth in particular in the appended claims. The invention itself, however, both as to its construction and its method of operation, together with additional objects and advantages thereof will be best understood from the following description of specific embodiments when read in connection with the accompanying drawings.

BRIEF DESCRIPTION OF THE DRAWING

The single FIGURE is a graph of the ion implantation doses necessary to achieve hard bubble suppression, including the use of boron ions as taught by the present invention.

DESCRIPTION OF THE PREFERRED EMBODIMENT

One feature of the present invention concerns the use of a low cost, low energy, high efficiency, high current ion source for specific ion implant applications. The justification for such a system is the cost of the present research type ion accelerators. These machines are very versatile, with a high degree of analytical function content and are a necessity in the research and development of ion implant technology. However, as a particular product or technological application becomes a standard process, the cost of applying research ion accelerators to production line processes with production type end stations is high. Moreover, such machines are production rate limiting, and not suited for operation by the usual product oriented personnel. In a product mode, the ideal application of ion implant technology would be one where the implant could be performed with a machine which is simply designed to meet the requirements of the specific process step. Another feature is to have the implant process performed in conjunction with another process step so that both steps could share some common equipment: For example, an ion implant step followed by a vacuum vapor deposition step.

The principal importance of ion implantation lies in the ability to introduce a well described and controlled distribution of foreign atoms into a host material. The technique can do this very reproducibly, accurately, and at low temperatures. The application of this technique has been applied specifically to magnetic bubble garnet epitaxial layers in order to suppress the nucleation of "hard" isolated domains.

One feature of the present invention is to provide low energy (~20 keV to ~50 keV) ion implant techniques with the purpose providing a simplified, large area, limited applications ion source for shallow, direct implantation into material surfaces. One particular vehicle for utilizing this development is in bubble domain garnet materials.

Wolfe "Applied Physics Letters", 19, 298 (1971) was the first to report on the use of ion implantation into magnetic bubble garnet films to increase the magnetic uniaxial anisotropy in materials that possess positive magnetostriction. Wolfe subsequently used the ion implantation technique on materials with negative magnetostriction. Wolfe found that ion implantation creates a compressive stress in the implanted surface layer which induce a sufficient in-plane anisotropy to overcome the vertical uniaxial anisotropy. The "capped" 90 degree domain wall, thus formed at the interface of the underneath perpendicular magnetic layer with the top in-plane implanted layer eliminates the vertical Bloch line structure in the 180 degree bubble domain cylindrical wall. This result is generally referred to as the suppression of "hard" bubbles.

The simplified nature of the ion implant application to bubble garnet wafers can be seen in the data shown in the FIGURE. This FIGURE shows the dosage reported that were at least adequate to achieve hard bubble suppression in a variety of garnet films plotted versus an implanting ion momentum function where the effective ion energy is 20 keV less than the reported energy. Such a plot suggests that the product of momentum and dose must equal or exceed some number in order to achieve suppression, i.e., (2 ME')·D ≧ constant. The dotted line shows the 25 kV ordinate line for HE. Helium would require $\sim 5 \times 10^{15}$ cm$^{-2}$ (at 25 keV) implant dosage or $\sim 3 \times 10^{15}$ cm$^{-2}$ (at 30 keV) implant dosage to achieve hard bubble suppression according to this plot. (This simplified analysis obviously has not taken into account the effect on differing magnetostriction coefficients among the various garnet compositions represented). The point is that some low energy ($\sim 25$ keV) ions, at moderate dose levels ($\sim 5 \times 10^{15}$) are sufficient to achieve hard bubble suppression in garnets.

One simplified ion source according to the present invention with the potential to deliver $\sim 1$ mA of He ion current is an RF (13.56 MHz) excitation plasma ion source. The magnet assists in trapping the electrons in the plasma and increasing the ionization efficiency at low gas pressures. The ion current density (N$^+$/dt) produced by an electron current density J, travelling a distance l through a gas of pressure P, is given by:

$$dN^+/dt = J\, Pl S_e$$

where $S_e$ is the differential ionization coefficient and is a function of the electron energy and the atom specie. ($S_e$(He)$\sim 1.0$ over the range $10^2$–$10^3$ eV.) The optimum extraction potential ($V_{ext}$) would be $\sim 1 \rightarrow 2 \times 10^3 V_{dc}$.

The electron source can be either a hot (thermionic) cathode or a cold cathode. Using either source, the electron density is typically $\sim 1$ A/cm$^2$. Recombination of the ionized specie will decrease the usable ion current density by $\sim \frac{1}{2}$. If a pressure P $\sim 10^{-4}$ Torr is assumed, l (plasma length) $\sim 10$ cm and $S_e \sim \frac{1}{2}$, with an ionization cross-section of $\sim 10$ cm$^2$, the total ion current from this ion generator would be:

$$dN^+/dT = \tfrac{1}{2}\,(1\ \text{A/cm}^2)\, 10^{-4}\, 10(\tfrac{1}{2})\,(10\ \text{cm}^2) \approx 2.5\ \text{mA}$$

Accelerating grids beyond the extraction would be designed to provide a quasi-collimated, energetic ion beam. The collimation configuration might be such as to give a large area beam, e.g., $\sim 75$ mm diameter at the target substrate. Assuming an efficiency factor in the accelerating column of $\sim 0.5$, the resultant ion flux density at the substrate would be:

$$n^+ \approx \frac{2.5 \times 10^{-3}}{1.6 \times 10^{-19}} \frac{4}{\pi(7.5)^2} \approx 2 \times 10^{14} \frac{\text{ions}}{\text{cm}^2/\text{sec}}$$

Hence the implant time for a 3.0" diameter substrate for $\sim 5 \times 10^{15}$ influence of helium ions would be $\sim 25$ sec.

Another feature of the present invention concerns the implantation of magnetic garnet to suppress the generation of hard bubbles by the use of the boron ion. Boron implantation has been successfully accomplished at an energy of 25,000 volts with a dosage of $4 \times 10^{15}$ ions/cm$^2$ and at an energy of 150,000 volts with a dosage of $2 \times 10^{14}$ ions/cm$^2$. Future ion implantation then will not require the time consuming changeover in the ion implant machines to implant materials which are not standard in the semiconductor process. Further, essentially any suitable ion energy can be used to implant any suitable ion provided: (1) that the energy used is sufficient to give an adequate implant depth ($\sim 500$ Å) or greater, and (2) the dosage of the implant meets a minimum value which is a function of the implant ion energy and mass according to the function:

$$M(E - E_o) \cdot D \gtrsim 2 \times 10^{-16} \frac{\text{gm ergs}}{\text{cm}^{-2}}$$

where
M is the mass of the implant ion in atomic mass units (A.M.U.)
E is the energy of the implant ion in electron volts
D is the integrated dose of the implant ion per square centimeter of implanted surface
$E_o = 20,000$ eV — a constant In addition to boron, one can use ions selected from the group consisting of arsenic, gallium, phosphorus, aluminum, zinc, or silicon to accomplish the same effect of hard bubble suppression.

Since the implanted depth of the ion in garnet is not critical, so long as it exceeds $\sim 500$ Å, the implant beam energy dispersion is not important. It is only necessary that the beam does not contain a significant amount of low energy ions which would result in sputtering of the implanted surface.

As is obvious from the literature, the range of the implant peak need only exceed $\sim 500$ Å at a minimum stress level, (governed by the implant ion size) for an effective implant process. Hence the use of low energy ($\gtrsim 20$ keV) implantation according to the present invention would be adequate for the task.

The minimum purity requirement of the implant in garnet is not known. However, the results, in the light of the variety of materials used to date, suggest that impurity control does not need to be emphasized strongly.

While the invention has been illustrated and described as embodied in a method of ion implantation for hard bubble suppression, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitutes essential characteristics of the generic or specific aspects of this invention, and, therefore, such adaptations should and are intended to be comprehended within the meaning and range of equivalence of the following claims.

I claim:

1. A method for processing a magnetic bubble domain device comprising the steps of:
   providing a non-magnetic substrate;
   providing a thin layer of magnetic material capable of supporting magnetic bubble domains on a first major surface of said substrate;
   directing a beam of ions consisting essentially of a non-gaseous element at said entire layer so that said ions are implanted at a depth in excess of 500 angstroms while minimizing the compressive stress in the implanted layer, and thereby minimizing the change in stress-induced anisotropy of the ion-damaged implanted layer, said entire layer still being capable of supporting magnetic bubble domains while hard bubble domains are suppressed after ion implantation.

2. A method as defined in claim 1, wherein said ions are selected from the group consisting of boron, arsenic, gallium, phosphorus, aluminum, zinc, or silicon.

3. A method as defined in claim 1, wherein the energy of said beam of ions is from 20 to 50 keV.

* * * * *

UNITED STATES PATENT AND TRADEMARK OFFICE
CERTIFICATE OF CORRECTION

PATENT NO. : 4,372,985
DATED : February 8, 1983
INVENTOR(S) : Robert F. Bailey

It is certified that error appears in the above-identified patent and that said Letters Patent are hereby corrected as shown below:

In column 3, line 61, following the word "extraction", please insert --electrode--.

Signed and Sealed this

Thirtieth Day of August 1983

[SEAL]

Attest:

GERALD J. MOSSINGHOFF

Attesting Officer

Commissioner of Patents and Trademarks